US009978847B2

United States Patent
Delalleau et al.

(10) Patent No.: US 9,978,847 B2
(45) Date of Patent: May 22, 2018

(54) METHOD FOR PRODUCING A HIGH-VOLTAGE TRANSISTOR WITH REDUCED FOOTPRINT, AND CORRESPONDING INTEGRATED CIRCUIT

(71) Applicant: STMicroelectronics (Rousset) SAS, Rousset (FR)

(72) Inventors: Julien Delalleau, Marseille (FR); Christian Rivero, Rousset (FR)

(73) Assignee: STMicroelectronics (Roussett) SAS, Rousset (FR)

( * ) Notice: Subject to any disclaimer, the term of this patent is extended or adjusted under 35 U.S.C. 154(b) by 0 days. days.

(21) Appl. No.: 15/454,184

(22) Filed: Mar. 9, 2017

(65) Prior Publication Data

US 2017/0179247 A1    Jun. 22, 2017

Related U.S. Application Data

(62) Division of application No. 15/068,732, filed on Mar. 14, 2016, now abandoned.

(30) Foreign Application Priority Data

Jul. 8, 2015 (FR) ...................... 15 56470

(51) Int. Cl.
*H01L 29/76* (2006.01)
*H01L 29/423* (2006.01)
(Continued)

(52) U.S. Cl.
CPC .... *H01L 29/4236* (2013.01); *H01L 21/02236* (2013.01); *H01L 21/28167* (2013.01);
(Continued)

(58) Field of Classification Search
CPC .......... H01L 29/4236; H01L 29/42368; H01L 29/42376; H01L 29/66545;
(Continued)

(56) References Cited

U.S. PATENT DOCUMENTS 5,270,257 A    12/1993  Shin
6,391,720 B1    5/2002  Sneelal et al.
(Continued)

FOREIGN PATENT DOCUMENTS

WO    WO-9943029 A1    8/1999

OTHER PUBLICATIONS

INPI Search Report and Written Opinion for FR 1556470 dated Apr. 25, 2016 (8 pages).

*Primary Examiner* — Tu-Tu Ho
(74) *Attorney, Agent, or Firm* — Crowe & Dunlevy (57) ABSTRACT

An integrated MOS transistor is formed in a substrate. The transistor includes a gate region buried in a trench of the substrate. The gate region is surrounded by a dielectric region covering internal walls of the trench. A source region and drain region are situated in the substrate on opposite sides of the trench. The dielectric region includes an upper dielectric zone situated at least partially between an upper part of the gate region and the source and drain regions. The dielectric region further includes a lower dielectric zone that is less thick than the upper dielectric zone and is situated between a lower part of the gate region and the substrate.

11 Claims, 6 Drawing Sheets

(51) Int. Cl.
    *H01L 29/66*     (2006.01)
    *H01L 21/306*     (2006.01)
    *H01L 29/78*     (2006.01)
    *H01L 21/02*     (2006.01)
    *H01L 21/28*     (2006.01)
    *H01L 21/311*     (2006.01)
    *H01L 29/08*     (2006.01)

(52) U.S. Cl.
    CPC .. *H01L 21/30604* (2013.01); *H01L 21/31111* (2013.01); *H01L 29/0847* (2013.01); *H01L 29/42368* (2013.01); *H01L 29/42376* (2013.01); *H01L 29/66545* (2013.01); *H01L 29/66621* (2013.01); *H01L 29/78* (2013.01)

(58) Field of Classification Search
    CPC ............... H01L 29/66621; H01L 29/78; H01L 21/02236; H01L 21/28167; H01L 21/30604; H01L 21/31111
    USPC ........................................................ 257/334
    See application file for complete search history.

(56) References Cited

U.S. PATENT DOCUMENTS

| | | | |
|---|---|---|---|
| 7,531,438 B2 * | 5/2009 | Chou | ................ H01L 21/26586 438/524 |
| 2007/0096185 A1 | 5/2007 | Kim et al. | |
| 2007/0141787 A1 | 6/2007 | Annese et al. | |
| 2007/0155119 A1 | 7/2007 | Muemmler et al. | |
| 2007/0249123 A1 * | 10/2007 | Chou | ................ H01L 21/26586 438/270 |
| 2012/0001258 A1 | 1/2012 | Kim | |

* cited by examiner

METHOD FOR PRODUCING A HIGH-VOLTAGE TRANSISTOR WITH REDUCED FOOTPRINT, AND CORRESPONDING INTEGRATED CIRCUIT

CROSS REFERENCE TO RELATED APPLICATIONS

This application is a divisional application from U.S. patent application Ser. No. 15/068,732 filed Mar. 14, 2016, which claims priority from French Application for Patent No. 1556470 filed Jul. 8, 2015, the disclosures of which are incorporated by reference.

TECHNICAL FIELD

Implementations and embodiments of the invention relate to integrated circuits, and more particularly the fabrication of metal oxide semiconductor (MOS) transistors capable of holding a high voltage, for example of the order of 15 volts, between the drain and the gate.

Such transistors can be used for example in the non-volatile memories of the electrically erasable and programmable type (EEPROM).

BACKGROUND

Generally, a high-voltage MOS transistor is a planar structure with an extended drain (MOS "drift") so as to exhibit a high breakdown voltage.

For example, an MOS transistor with extended drain generally comprises an additional drain region called a "drift region" that has a lower density of dopants between the gate region and the normal drain region of the MOS transistor so as to avoid an excessively high electrical field upon an application of a high voltage between the gate and the drain of the MOS transistor.

However, since the gate dielectric layer of an MOS transistor with extended drain is generally uniform and thin, the end part of this dielectric layer situated in the vicinity of the drain always risks being broken down because of an electric field crowding phenomenon upon the application of a high voltage.

Moreover, an MOS transistor with planar extended drain is also costly in terms of surface footprint.

SUMMARY

Thus, according to one implementation and embodiment, it is proposed to reduce the silicon imprint of a high-voltage MOS transistor while offering electrical performance levels equivalent to or greater than those of a conventional planar transistor.

According to one aspect, an integrated circuit is proposed that comprises a substrate and at least one MOS transistor comprising: a gate region buried in a trench of the substrate, emerging on a top face of the substrate, and surrounded by a dielectric region covering the internal walls of the trench, a source region and a drain region situated respectively in the substrate on either side of the trench in the vicinity of said top face, said dielectric region having an upper dielectric zone situated at least partially between an upper part of the gate region and the source and drain regions, and a lower dielectric zone less thick than the upper dielectric zone and situated between a lower part of the gate region and the substrate.

Such an MOS transistor with buried gate with a non-uniform gate dielectric dimension makes it possible not only to retain the electrical performance levels of the MOS transistor by using the relatively thin lower dielectric zone between the channel region and the gate region, but also to reduce the risk of breakdown by using the thicker upper dielectric zone between the drain region and the gate region.

Furthermore, such a high-voltage transistor does not require insulating spacers.

By way of indication, the maximum thickness of the upper dielectric zone can be of the order of 20 nm, and is greater than the average thickness of 15 nm of a gate dielectric layer of a high-voltage MOS transistor with planar structure.

Advantageously, the vertical structure of the gate region of the MOS transistor with buried gate also makes it possible to reduce the silicon imprint of the transistor, for example up to 30%, and this structure is applicable for both types, N and P, of MOS transistors.

According to one possible variant, the gate region comprises a gate setback zone between the lower part and the upper part of the gate region.

According to another possible variant, the dielectric region comprises a dielectric setback zone between the lower dielectric zone and the upper dielectric zone.

According to another aspect, a method for fabricating an MOS transistor is proposed, comprising: a formation of a gate region buried in a trench of the substrate, emerging on a top face of the substrate, a formation of a source region and of a drain region situated respectively in the substrate on either side of the trench in the vicinity of said top face, a formation of a dielectric region covering the internal walls of the trench, surrounding the gate region and having an upper dielectric zone situated at least partially between an upper part of the gate region and the source and drain regions, and a lower dielectric zone less thick than the upper dielectric zone and situated between a lower part of the gate region and the substrate.

Such a fabrication method that is completely compatible with a CMOS fabrication flow advantageously makes it possible to reduce the number of masks used.

According to one possible variant, the formation of the gate region comprises a formation of a gate setback zone between the lower part and the upper part of the gate region.

According to an implementation applicable to this variant, the formations of the dielectric region and of the gate region comprise: a formation of a first dielectric layer covering the internal wall of the trench, a formation of a sacrificial gate region covering the first dielectric layer and filling the trench, a partial removal of the sacrificial gate region so as to obtain the lower part of the gate region surrounded by the lower dielectric zone, a formation of a second dielectric layer covering the first dielectric layer and the lower part of the gate region, a removal of the portion of the second dielectric layer covering the lower part of the gate region so as to obtain the upper dielectric zone, and a formation of the gate region comprising the upper part separated from the lower part by the gate setback zone and surrounded by the upper and lower dielectric zones.

According to another possible variant, the formation of the dielectric region comprises a dielectric setback zone between the lower dielectric zone and the upper dielectric zone.

According to an implementation applicable to this other variant, the formations of the dielectric region and of the gate region can comprise: a partial etching of an isolation trench leaving a first dielectric layer remaining on its lateral walls and a partial etching of the underlying substrate so as to obtain said trench, a formation on the first dielectric layer and on the walls of the lower part of the trench of a second dielectric layer so as to obtain said dielectric setback region, and a filling of the trench by a gate material.

BRIEF DESCRIPTION OF THE DRAWINGS

Other advantages and features of the invention will become apparent on studying the detailed description of embodiments, taken as non-limiting examples and illustrated by the attached drawings in which.

DETAILED DESCRIPTION

Figure 1:
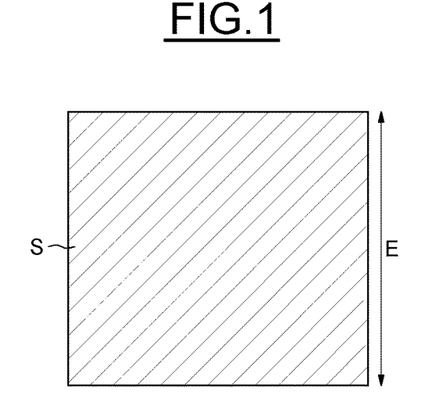
FIGS. 1 to 11 schematically illustrate process steps for a first implementation and embodiment.

FIG. 1 illustrates a substrate S, for example of silicon and with a thickness E of the order of 2 µm, provided for the production of at least one MOS transistor with buried gate TGE according to the invention.

Figure 2:
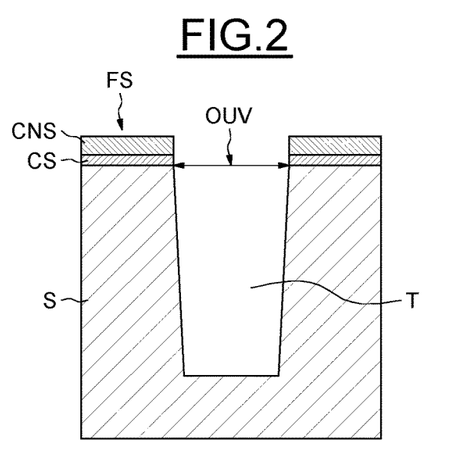

First of all, a sacrificial layer CS, of $SiO_2$ type known to those skilled in the art by the name sacrificial oxide "SACOX", for example of the order of a few nanometers, is formed by oxidation over the entire top face FS of the substrate S (FIG. 2).

Next, a layer of silicon nitride CNS is produced in a conventional manner that is known per se.

This layer of nitride CNS is used then as a hard mask in a subsequent step of anisotropic etching to form a trench T in the substrate S. The opening OUV of the trench T in proximity to the top face FS of the substrate S is, for example, of the order of 200 nm and the depth of the trench T is, for example, of the order of 0.5 µm.

Figure 3:
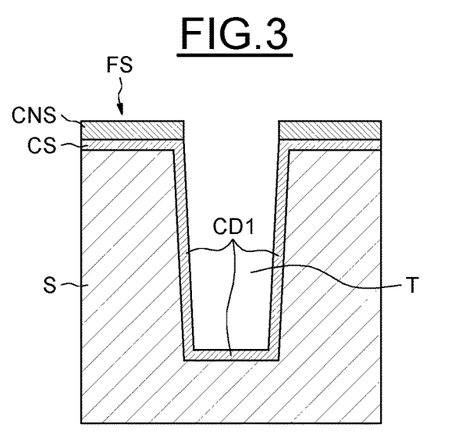

Then, a first dielectric layer CD1, for example of the order of a few nanometers, is formed by re-oxidation, covering the entire internal wall of the trench T (sidewalls and bottom), as can be seen in FIG. 3.

Figure 4:
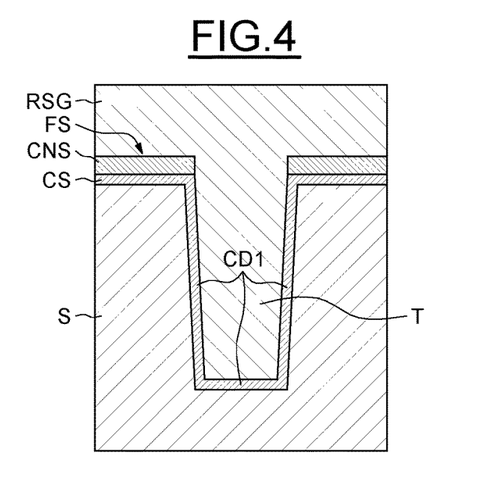

FIG. 4 illustrates a step of deposition of a sacrificial gate region RSG, for example of poly-silicon, in the trench T, and over the entire substrate S. Such deposition is conventional and known per se.

Figure 5:
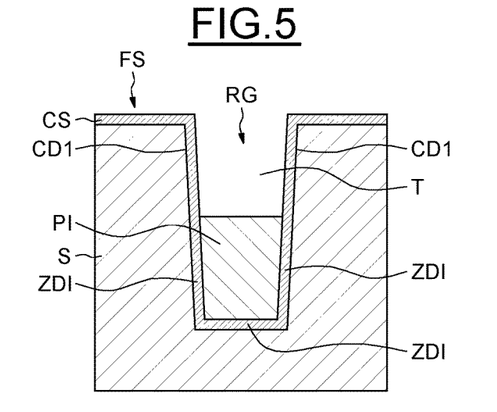

In FIG. 5, the sacrificial gate region RSG deposited in the preceding step is partially removed by a conventional step of anisotropic dry etching so as to obtain a lower part PI. This lower part PI is surrounded by a lower dielectric zone ZDI covering the internal wall of the trench T.

Figure 6:
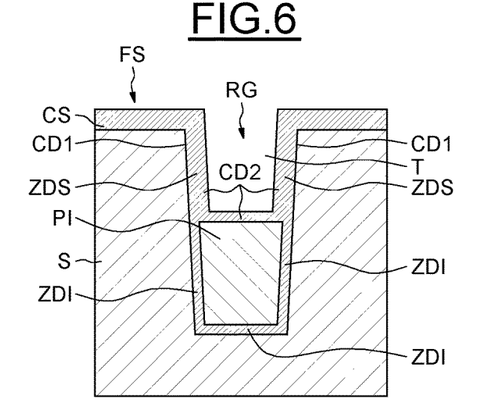

Oxide growth is then used to reform a second dielectric layer CD2 covering the upper zone of the first dielectric layer CD1 and the lower part PI, as illustrated in FIG. 6.

Figure 7:
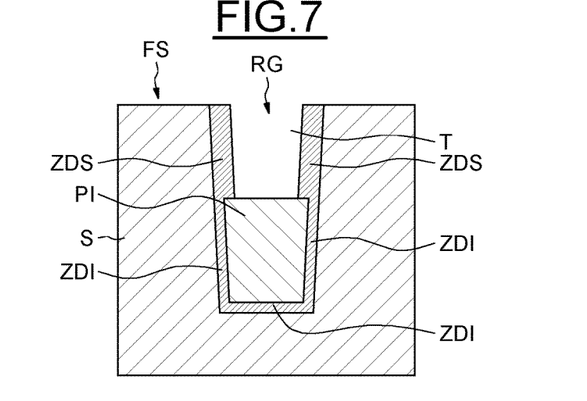

Then, a partial removal of the second dielectric layer CD2 is performed, by an anisotropic dry etching, in order to obtain an upper dielectric zone ZDS, situated above the lower dielectric zone ZDI, and thicker than the lower dielectric zone ZDI (FIG. 7).

This difference in thickness between the upper dielectric zone ZDS and the lower dielectric zone ZDI offers a two-fold advantage to the electrical performance levels of the future MOS transistor, as will be seen in more detail hereinbelow.

Figure 8:
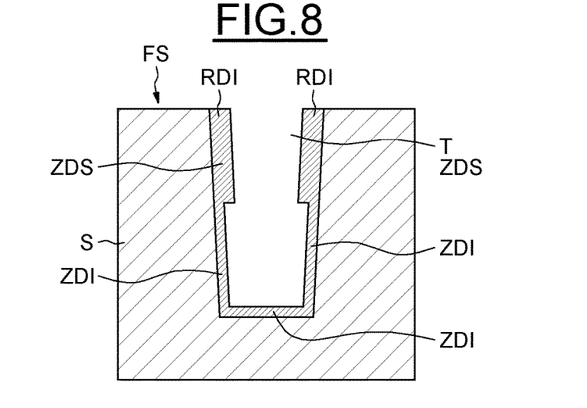
Figure 9:
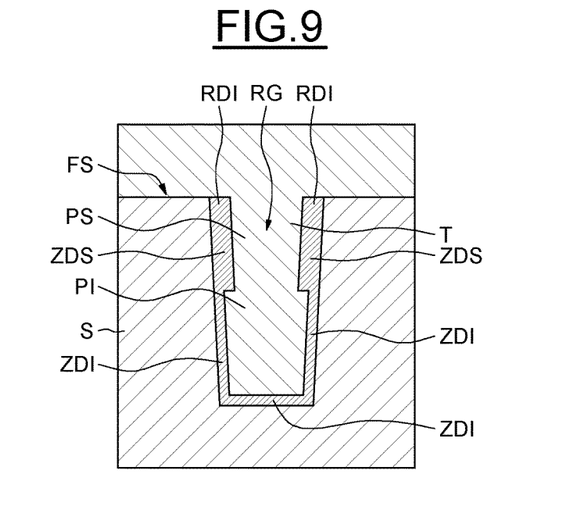

For the formation of an upper part PS of the gate region RG, it is possible to completely remove, in a first step, the lower part PI of the gate region RG situated in the trench (FIG. 8) and to form, in a second step, by a conventional gate deposition step, the complete gate region RG comprising the lower part PI surrounded by the lower dielectric zone ZDI and the upper part PS surrounded by the upper dielectric zone ZDS, as shown in FIG. 9.

As a variant, it would be possible to directly form, by a conventional gate deposition step, an upper part PS of the gate region RG situated above the lower part PI to obtain the same gate region RG as that illustrated in FIG. 9.

After mechanical-chemical polishing, the gate region RS is obtained (FIG. 10) having a lower part PI and an upper part PS respectively surrounded by the lower ZDI and upper ZDS dielectric zones covering the trench T.

Figure 10:
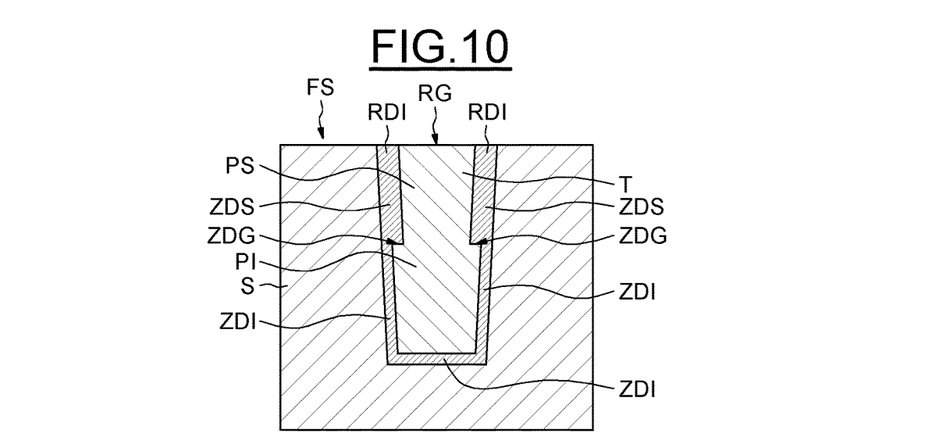

It should be noted that, since the upper dielectric zone ZDS is thicker than the lower dielectric zone ZDI, the gate region RS comprises a gate setback zone ZDG between the lower part PI and the upper part PS having a step change in lateral width of the gate region.

Figure 11:
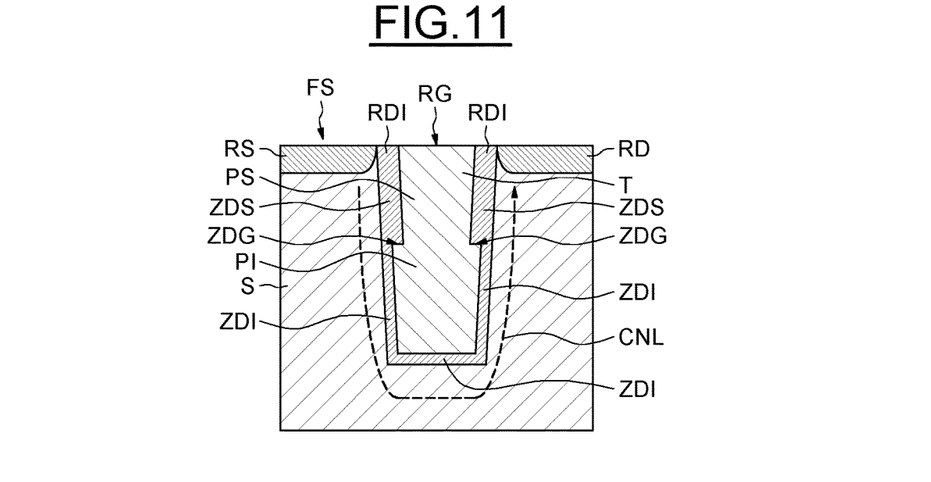

Then, conventional steps that are known per se are used to form a source region RS and a drain region RD situated respectively in the substrate S on either side of the trench T in the vicinity of said top face FS of the substrate S.

An MOS transistor with buried gate TGE is thereby finally obtained, implemented in an integrated circuit IC, as illustrated in FIG. 11.

It should be noted that the upper dielectric zone ZDS is situated at least partially between the upper part PS of the gate region RG and the source RS and drain RD regions.

The transistor TGE therefore comprises a buried gate with a U-shaped channel CNL.

The fact that the upper dielectric zone ZDS is relatively thicker, for example with a maximum thickness of the order of 20 nm, makes it possible to obtain a high breakdown voltage between drain and gate.

The fact that the lower dielectric zone ZDI remains thin, for example 9 nm thick, over most of the channel CNL ensures good electrical performance levels for the MOS transistor TGE.

It is possible to obtain an imprint reduction of up to 30% relative to a planar MOS transistor.

In a possible variant illustrated in FIGS. 12 to 19, an MOS transistor with buried gate TGE can be formed from a conventional shallow trench isolation (STI).

Figure 12:
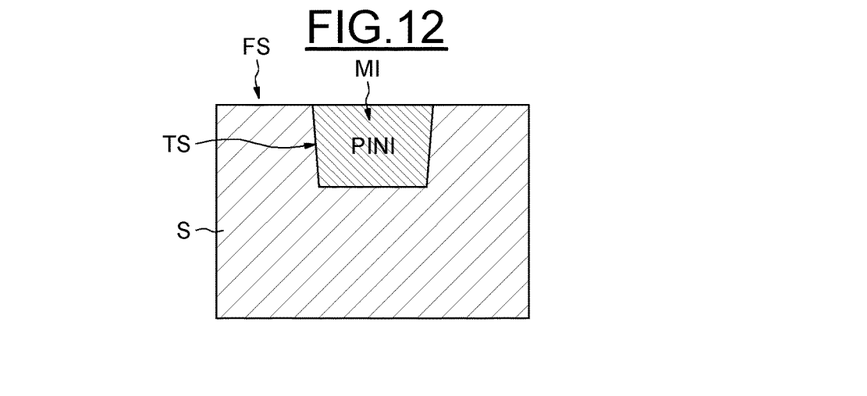
FIGS. 12-16 schematically illustrate process steps for a second implementation and embodiment.

FIG. 12 illustrates such an isolation trench TS emerging on the top face FS of the substrate S and filled by an insulating material MI, for example silicon dioxide.

The edges of this isolation trench TS form, de facto, an initial part PINT of the future trench T of the MOS transistor with buried gate TGE.

Figure 13:
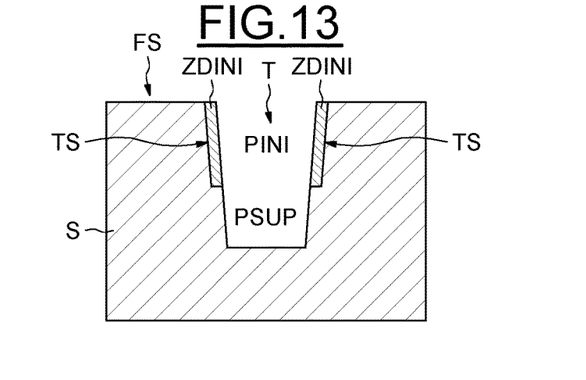

First of all an anisotropic etching is used to remove a part of the insulating material MI and a part of the substrate S situated under the initial part PINT so as to obtain an additional part PSUP of the trench T (FIG. 13).

A part ZDINI of the material MI remains on the edges (sidewalls) of the initial part PINI of the trench T and forms a first dielectric layer.

Figure 14:
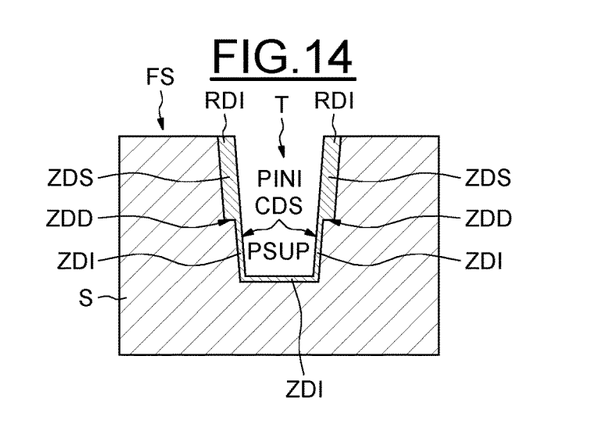

Then, oxidation is used to form a second dielectric layer CDS covering the part ZDINI and covering the additional part PSUP of the trench T so as to obtain a lower dielectric zone ZDI covering the additional part PSUP of the trench T and an upper dielectric zone ZDS covering the initial part PINT of the trench T (FIG. 14).

It will be noted that the dielectric region RDI comprises a dielectric setback zone ZDD between the lower dielectric zone ZDI and the upper dielectric zone ZDS having a step change in the lateral dielectric layer thickness.

Figure 15:
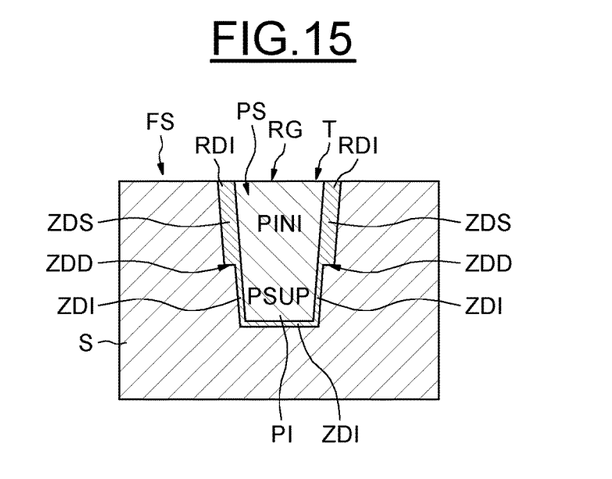

After a conventional step of deposition of the gate material, for example poly-silicon, the gate region RG is formed, surrounded by the upper dielectric zone ZDS in the initial part PINT of the trench T and by the lower dielectric zone ZDI in the additional part PS of the trench T, as illustrated in FIG. 15.

Figure 16:
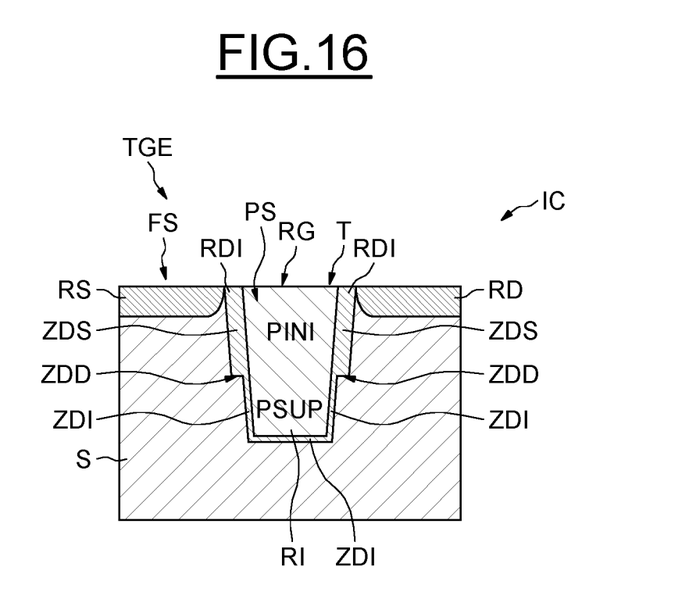

FIG. 16 shows the MOS transistor with buried gate TGE produced in the integrated circuit IC after the conventional formation of the drain RD and source RS regions.

The invention claimed is:

1. A method, comprising;
   forming an initial trench in a top surface of a semiconductor substrate;
   completely filling the initial trench with a dielectric material;
   etching an opening in the dielectric material that extends completely through the dielectric material, while leaving an upper insulating sidewall made from the dielectric material, said opening further extending into the semiconductor substrate to form an extended trench below said initial trench;
   lining sidewalls and a bottom of the extended trench with a dielectric liner;
   filling the opening with a gate material to form a gate electrode insulated from the semiconductor substrate by the upper insulating sidewall and the dielectric liner; and
   forming source and drain regions in the semiconductor substrate on opposite sides of the initial trench.

2. The method of claim 1, wherein the upper insulating sidewall has a first thickness and wherein the dielectric liner has a second thickness that is less than the first thickness.

3. The method of claim 1, wherein the trench has a depth greater than a depth of the source and drain regions.

4. The method of claim 1, wherein lining sidewalls and the bottom of the extended trench with the dielectric liner comprises oxidizing a surface of the semiconductor substrate exposed by the extended trench.

5. The method of claim 1, wherein etching the opening further comprises forming the sidewalls of the extended trench to be in surface alignment with inner walls of the upper insulating sidewall.

6. A method, comprising;
   forming a trench in a top surface of a substrate;
   filling the trench with a dielectric material;
   etching an initial part of an opening through the dielectric material leaving an upper insulating sidewall made from the dielectric material;
   etching a further part of said opening extending into the substrate;
   lining sidewalls and a bottom of the further part of said opening with a dielectric liner such that an inner wall of the dielectric liner is aligned with an inner wall of the upper insulating sidewall;
   filling the initial part of the opening and the further part of said opening with a gate material to form a gate electrode separated from the substrate by an insulating layer made from the upper insulating sidewall having a first thickness and made from the dielectric liner made having a second thickness less than the first thickness; and
   forming source and drain regions on opposite sides of the trench.

7. The method of claim 6, wherein the trench has a depth greater than a depth of the source and drain regions.

8. The method of claim 6, wherein lining sidewalls and the bottom of the further part of said opening with the dielectric liner comprises oxidizing a surface of the semiconductor substrate exposed by the further part of said opening.

9. An integrated circuit, comprising:
   a substrate;
   a metal oxide semiconductor transistor comprising:
      a gate region buried in a trench of the substrate and emerging on a top face of the substrate, said gate region surrounded by a dielectric region covering internal walls of the trench;
      a source region and a drain region situated respectively in the substrate on opposite sides of the trench in a vicinity of said top face;
      said dielectric region having an upper dielectric zone situated at least partially between an upper part of the gate region and the source and drain regions, and a lower dielectric zone, which is less thick than the upper dielectric zone, situated between a lower part of the gate region and the substrate, wherein the dielectric region comprises a dielectric setback zone between the lower dielectric zone and the upper dielectric zone, and wherein an inner wall of the lower dielectric zone is aligned with an inner wall of the upper dielectric zone.

10. A integrated circuit, comprising:
    a substrate having a top surface;
    a trench extending into the substrate from the top surface, said trench having sidewalls and a bottom;
    a dielectric layer covering said sidewalls and bottom;
    a gate electrode filling said trench and separated from the substrate by said dielectric layer;
    source and drain regions in said substrate on opposite sides of the trench;
    wherein said dielectric layer covering said sidewalls has a first sidewall thickness in an upper portion of said trench and a second sidewall thickness in a lower portion of said trench, said first sidewall thickness being greater than said second sidewall thickness; and
    wherein the dielectric layer includes a dielectric setback zone at a depth of the trench where the thickness of the dielectric layer changes from the first sidewall thickness to the second sidewall thickness, and wherein an inner wall of the dielectric layer above the dielectric setback zone is aligned with an inner wall of the dielectric layer below the dielectric setback zone.

11. The integrated circuit of claim 10, wherein the dielectric setback zone defines a step change in a lateral width of the dielectric layer thickness.

* * * * *

UNITED STATES PATENT AND TRADEMARK OFFICE
CERTIFICATE OF CORRECTION

PATENT NO. : 9,978,847 B2
APPLICATION NO. : 15/454184
DATED : May 22, 2018
INVENTOR(S) : Julien Delalleau et al.

Page 1 of 1

It is certified that error appears in the above-identified patent and that said Letters Patent is hereby corrected as shown below:

In the Specification

At Column 4, Lines 46, 50, and 60, please replace the term [[PINT]] with -- PINI --.

At Column 5, Line 1, please replace the term [[PINT]] with -- PINI --.

Signed and Sealed this
Fourth Day of September, 2018

Andrei Iancu
*Director of the United States Patent and Trademark Office*